United States Patent
Bart

(10) Patent No.: US 11,457,258 B2
(45) Date of Patent: Sep. 27, 2022

(54) BROADCASTING SYSTEM AND METHOD OF PROCESSING DATA TO BE TRANSMITTED OVER THE AIR

(71) Applicant: Rohde & Schwarz GmbH & Co. KG, Munich (DE)

(72) Inventor: Alex Bart, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 56 days.

(21) Appl. No.: 17/090,489

(22) Filed: Nov. 5, 2020

(65) Prior Publication Data

US 2021/0185364 A1 Jun. 17, 2021

(30) Foreign Application Priority Data

Dec. 12, 2019 (EP) ..................................... 19215689

(51) Int. Cl.
*H04N 21/2383* (2011.01)
*H04L 1/00* (2006.01)
*H04N 21/438* (2011.01)

(52) U.S. Cl.
CPC ....... *H04N 21/2383* (2013.01); *H04L 1/0071* (2013.01); *H04N 21/4382* (2013.01)

(58) Field of Classification Search
CPC ............ H04N 21/2383; H04N 21/4382; H04L 1/0071; H04L 1/0041; H04L 65/4076; H04L 65/602; H04L 65/60; H03M 13/6502
USPC ........................................................ 375/265
See application file for complete search history.

(56) References Cited

U.S. PATENT DOCUMENTS

| | | | |
|---|---|---|---|
| 10,110,298 B2 | 10/2018 | Miller | |
| 2011/0150113 A1* | 6/2011 | Oyman | H04B 7/0456 375/295 |
| 2018/0062788 A1 | 3/2018 | Mayer et al. | |

FOREIGN PATENT DOCUMENTS

EP 2611099 A1 7/2013

OTHER PUBLICATIONS

ATSC Advanced Television Systems Committee: "ATSC Standard: Scheduler/Studio to Transmitter Link," <https://docplayer.net/100928129-Atsc-standard-scheduler-studio-to-transmitter-link.html> Jan. 2018, 83 pages.

* cited by examiner

*Primary Examiner* — Fitwi Y Hailegiorgis
(74) *Attorney, Agent, or Firm* — Christensen O'Connor Johnson Kindness PLLC

(57) ABSTRACT

A broadcasting system for broadcasting and/or streaming of data includes a gateway and at least one transmitter. The gateway is configured to forward digital content received to the transmitter. The transmitter is configured to transmit the digital content over-the-air. The broadcasting system includes channel coding circuitry that is separately formed with respect to the transmitter. The channel coding circuitry is configured to perform the channel coding of the digital content at least partly which is to be transmitted over-the-air by the transmitter. Furthermore, a method of processing data to be transmitted over-the-air is described.

18 Claims, 1 Drawing Sheet

BROADCASTING SYSTEM AND METHOD OF PROCESSING DATA TO BE TRANSMITTED OVER THE AIR

FIELD OF THE DISCLOSURE

Embodiments of the present disclosure relate to a broadcasting system for broadcasting and/or streaming of data. Further, embodiments of the present disclosure relate to a method of processing data to be transmitted over-the-air.

BACKGROUND

Broadcasting systems for broadcasting and/or streaming data over-the-air, also called broadcast networks, relate to a group of transmitters, for instance radio stations, television stations or other electronic media outlets, that broadcast respective content from a centralized source. Broadcasting systems become more and more important since more content is distributed over-the-air in this day and age.

The signals broadcasted are typically distributed via communication channels referring to a physical transmission medium, for instance a wire, or to a logical connection over a multiplexed medium, for instance a radio channel. In fact, the communication channel is used to convey the respective data or rather information, for example a digital bit stream, from one or several transmitters to one or several receivers. In a respective communication channel, two or more different transmitters may transmit their respective data to different destinations, namely receivers. This might result in cross-talk or co-channel interference which is not intended. Therefore, the data transmitted is coded by the respective transmitters ensuring that cross-talk or co-channel interference on the respective signals do not occur.

However, modern broadcasting systems or rather broadcast networks comprise several transmitters. Thus, each of the transmitters used in the broadcasting system has to be as cost-efficient as possible in order to reduce the entire costs of the broadcasting system.

Accordingly, there is a need for a cost-efficient broadcasting system having the same functionality.

SUMMARY

Examples of a broadcasting system for broadcasting and/or streaming of data are provided. The broadcasting system comprises a gateway and at least one transmitter. The gateway is configured, for example, to forward digital content received to the transmitter. The transmitter is configured, for example, to transmit the digital content over-the-air. Further, the broadcasting system comprises, for example, a channel coding module, composed of one or more circuits, that is separately formed with respect to the transmitter. The channel coding module is configured, for example, to perform the channel coding of the digital content at least partly which is to be transmitted over-the-air by the transmitter.

Further, examples of a method of processing data to be transmitted over-the-air is provided. In an embodiment, the method comprises the following steps:
 providing digital content to be transmitted by a gateway;
 forwarding the digital content to at least one transmitter by a gateway;
 performing a channel coding of the digital content at least partly by, for example, a channel coding module that is separately formed with respect to the transmitter; and
 forwarding the at least partly coded digital content to the transmitter.

Accordingly, the costs of the entire broadcasting system can be reduced since a separately formed channel coding module is provided that at least partly performs the channel coding of the digital content. Therefore, it is not necessary that the transmitter comprises an integrated processing unit that is able to perform the channel coding by itself. In some embodiments, the computational power required for the transmitter can be reduced significantly so that the entire costs of the transmitter can be reduced. Moreover, the overall costs for the broadcasting system can be reduced significantly, as the broadcasting system typically comprises several transmitters. Each of these transmitters does not have to comprise its own processing unit that is able to perform the channel coding. Therefore, the cost reduction for each transmitter is multiplied by the number of transmitters provided in the broadcasting system. Irrespective of the cost reduction, the channel coding itself can be optimized as it is performed by the upstream channel coding module that might have more computational power than the processing units typically used within each transmitter. Put differently, a stand-alone system, namely the channel coding module, is provided that is only used for channel coding (at least partly).

Generally, the broadcasting system may be configured to provide a further evolved Multimedia Broadcast Multicast Service (feMBMS) or a Digital Video Broadcasting-Terrestrial, 2nd generation (DVB-T2).

The respective algorithm for encoding the data to be transmitted by the respective transmitter is run on the separately formed channel coding module instead of the transmitter. In some embodiments, the channel coding module may relate to a pre-coder since the channel coding module is located upstream of the transmitter, namely prior to the respective transmitter in the data processing stream.

According to an aspect, the channel coding module is configured to at least pre-code a signal to be transmitted over-the-air. In some embodiments, the channel coding module is configured to completely encode the signal to be transmitted over-the-air. A signal to be transmitted over-the-air is pre-coded by the channel coding module. In some embodiments, the signal is completely encoded. Thus, at least the computationally intensive coding steps may be outsourced from the transmitter to the separately formed channel coding module since these steps are done by the channel coding module. As already mentioned above, the separately formed channel coding module may have a higher computational power than the processing units of the transmitters known in the state of the art typically have.

Therefore, enhanced channel coding or at least faster processes, namely channel coding processes, can be ensured.

The separately formed channel coding module may also completely encode the digital content to be transmitted such that the respective transmitter receives a completely coded (and scrambled) signal encompassing the digital content, wherein the signal is transmitted by the respective transmitter later.

Another aspect provides that the channel coding module is configured to forward at least one control signal to the transmitter. The at least one control signal may be forwarded to the transmitter by the channel coding module. The at least one control signal may relate to a time stamp and/or a transmission time at which the respective data content forwarded, namely the signal encompassing the data content, shall be transmitted over-the-air by the transmitter.

Thus, the channel coding module also controls the transmitter in a desired manner ensuring proper operation of the entire broadcasting system.

The channel coding module may be interconnected between the gateway and the transmitter. Thus, the respective digital content to be transmitted is forwarded to the channel coding module that analyzes the digital content in order to perform the channel coding in the intended manner. The at least partly coded signal is then forwarded to the transmitter for being transmitted over-the-air.

Further, the channel coding module may be connected with an interface that is provided upstream of the transmitter or at the transmitter. In any case, the channel coding module is enabled to at least pre-code, for example completely encode, the digital content to be transmitted before the digital content is processed by the transmitter. This ensures that the transmitter only receives the data being pre-processed by the channel coding module. In some embodiments, the transmitter only receives the at least partly coded data.

For instance, the channel coding module is a separately formed processing unit, such as a processing circuit, central processing unit (CPU), etc. In some embodiments, the channel coding module is a server that may be located at a different location, for instance abroad. In any case, the channel coding module is configured to communicate with the gateway as well as the transmitter in order to receive and forward the respective data.

According to another aspect, the transmitter and the channel coding module are interconnected with each other via a respective communication interface. The communication interface may be established by an Ethernet interface. Hence, the respective data is exchanged by a standardized protocol, for instance the internet protocol (IP).

A further aspect provides that the transmitter is established in an encoder-free manner. In case of a complete channel coding performed by the channel coding module, it is not necessary that the respective transmitter comprises an internal encoder. Thus, the transmitter may be established in an encoder-free manner since all encoding functions are done separately by the separately formed channel coding module.

Another aspect provides that the broadcasting system comprises several transmitters that are assigned to the gateway and the channel coding module. Hence, the digital content to be transmitted by the several transmitters is provided by the centralized gateway or rather the common gateway. In a similar manner, the channel coding module is configured to encode the respective signals at least partly for all of the several transmitters that are assigned to the common channel coding module.

The channel coding module may be a centralized channel coding module since the channel coding module interacts with all of the several transmitters provided by the broadcasting system.

For instance, the broadcasting system is a single frequency network (SFN). The single frequency network is a broadcast network where several transmitters simultaneously send the same signal over the same frequency channel, also called communication channel. The respective transmitters can be established in a cost-efficient manner as they have been established in an encoder-free manner.

According to an aspect, the transmitter performs baseband signal processing. Thus, the transmitter is configured to only perform baseband signal processing, as the respective channel coding is done by the separately formed channel coding module.

Generally, the channel coding module is separately formed with respect to the gateway and the transmitter. In other words, the channel coding module, the gateway and the at least one transmitter each have their own housing. However, the channel coding module is interconnected between the gateway and the at least one transmitter, thereby establishing a transmission line.

In other words, the channel coding module is not commonly housed with the at least one transmitter and/or the gateway.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
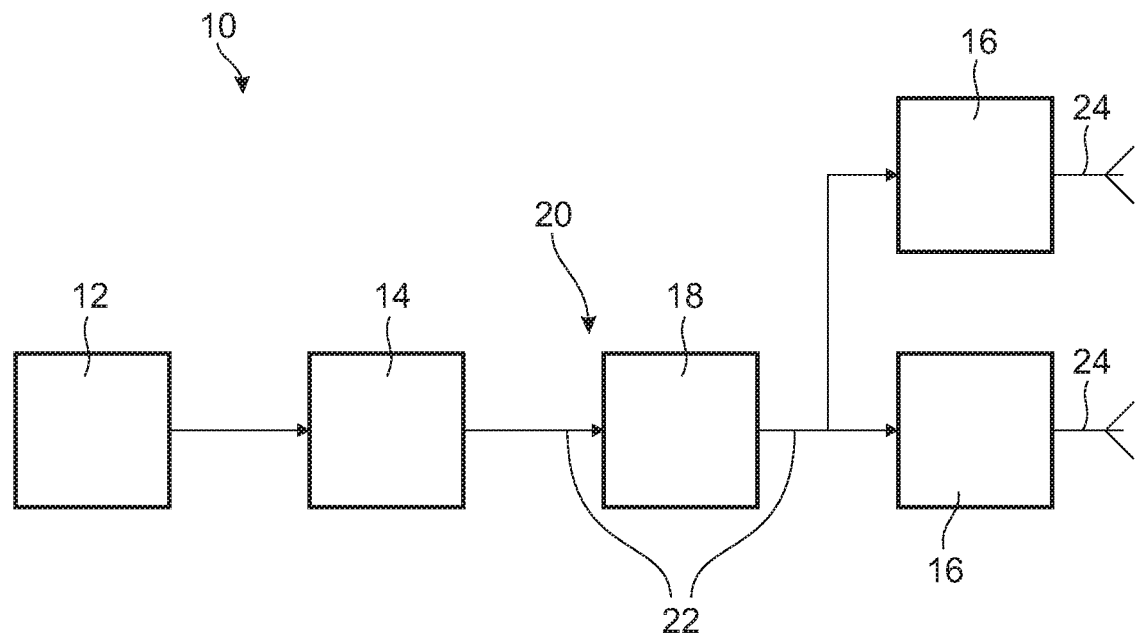
FIG. 1 schematically shows a broadcasting system according to an embodiment of the present disclosure.

In FIG. 1, a broadcasting system 10 is shown that comprises a data source 12 as well as a gateway 14 that is connected with the data source 12, for instance via an Ethernet connection. Additionally, the broadcasting system 10 comprises several transmitters 16 that are assigned to the single gateway 14 for forming a centralized gateway 14 for the several transmitters 16. The broadcasting system 10 further includes a channel coding module 18, composed for example of one or more circuits. The channel coding module 18 is separately formed with respect to the transmitters 16 and the single gateway 14 as shown in FIG. 1.

In some embodiments, the term "channel coding module" (or "unit," "device," etc.) refers to a combination of hardware (e.g. a processor such as an integrated circuit or other circuitry) and software (e.g. machine- or processor-executable instructions, commands, or code such as firmware, programming, object code, etc.) for carrying out the functionality described in embodiments herein. The combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a central processing unit (CPU), a graphical processing unit (GPU), a field programmable gate array (FPGA), an application specific integrated circuit (ASIC), or other types of electronic circuitry.

In some embodiments, the channel coding module 18 is interconnected between the gateway 14 and the transmitters 16. Thus, an interface 20 is provided upstream of the transmitters 16 via which the channel coding module 18 is integrated in the broadcasting system 10. Thus, the channel coding module 18 is located between the gateway 14 and the transmitters 16.

The channel coding module 18 may be established by a separately formed processing unit, for instance a server, which, via the interface 20, interfaces a transmission line 22 established between the gateway 14 and the transmitters 16. The channel coding module 18 may be connected with the transmitters 16 via a respective communication interface such as an Ethernet interface. The channel coding module 18 is also connected with the gateway 14 via a respective communication interface, for example the same communication interface used between the transmitters 16 and the channel coding module 18. Therefore, the channel coding module 18 may also be connected with the gateway 14 via an Ethernet interface.

Figure 2:
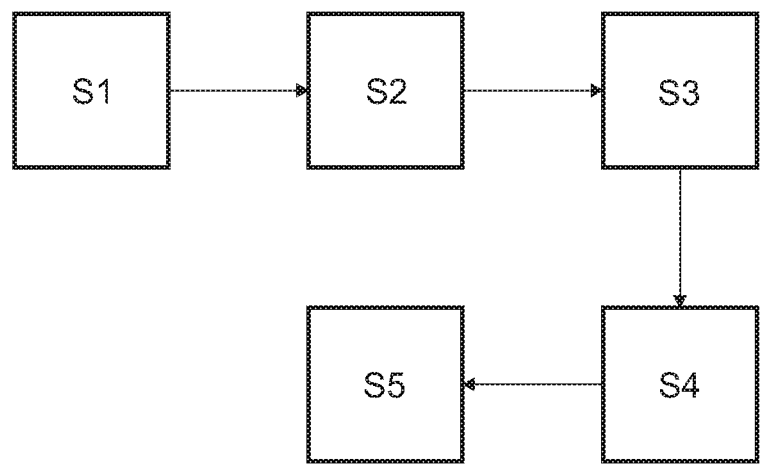
FIG. 2 shows a flow-chart of a method of processing data to be transmitted according to an embodiment of the present disclosure.

In general, the broadcasting system 10 shown in FIG. 1 is configured to perform a method shown in FIG. 2 according to which data to be transmitted over-the-air is processed.

The gateway 14 is configured to forward digital content received to the several transmitters 16. The digital content may be forwarded to the gateway 12 by the source 12 previously.

The transmitters 16 are each configured to transmit the digital content received from the gateway 14. For transmitting the respective digital content, the transmitters 16 each comprise an antenna 24 such that the digital content is transmitted over-the-air by (radio) signals that are received by respective receivers.

As already shown in FIG. 1, the channel coding module 18 is interconnected between the gateway 14 and the transmitters 16 such that the digital content forwarded to the transmitters 16 is previously processed by the channel coding module 18.

The channel coding module 18 performs a channel coding of the digital content to be transmitted over-the-air at least partly. This means that a pre-coding of the digital content is done by the channel coding module 18. Hence, a pre-coded signal is provided that is forwarded to the transmitters 16 for being broadcasted over-the-air.

The channel coding module 18 may pre-code the signal to be transmitted or rather completely encode the signal to be transmitted. In some embodiments, the channel coding module 18 may also perform a scrambling on the respective data to be transmitted.

Accordingly, the respective transmitters 16 may be established in an encoder-free manner since the entire encoding, namely the channel coding, is done by the separately formed channel coding module 18.

In other words, the channel coding is (completely) outsourced from the respective transmitters 16 to the channel coding module 18.

Therefore, the individual transmitters 16 may be established in a more cost-efficient manner, as it not necessary that the transmitters 16 do have to comprise a processing unit with sufficient computational power to perform channel coding on the data received. Thus, the entire broadcasting system 10 can be established in a more cost-efficient manner.

In some embodiments, this is important in case of a single frequency network (SFN) established by the broadcasting system 10, as the single frequency network typically comprises several transmitters 16.

As shown in FIG. 1, the channel coding module 18 is located between the central gateway 14 and the several transmitters 16. Thus, the channel coding module 18 is a centralized channel coding module since all data streams or rather signals forwarded to the transmitters 16 are preprocessed by the channel coding module 18 previously.

In general, the broadcasting system 10 may process transport streams that are broadcasted by the several transmitters 16. In addition to the digital content to be transmitted over-the-air, the channel coding module 18 is also configured to forward at least one control signal to the respective transmitters 16. The control signals may relate to a time stamp (of the data processed) or rather a transmission time at which the transmitters 16 shall transmit the respective data received over-the-air. Hence, the channel coding module 18 is also configured to ensure proper operation of the entire broadcasting system 10 as the control signals are also distributed in the broadcasting system 10, for example forwarded to the individual transmitters 16.

Accordingly, the broadcasting system 10 is configured to provide digital content to be transmitted by the gateway 14 in a first step S1.

In a second step S2, the digital content is forwarded to at least one transmitter 16 by the gateway 14.

In a third step S3, a channel coding of the digital content is performed by the channel coding module 18 before the digital content is received by the respective transmitters 16. The channel coding module 18 is configured to at least partly encode the digital content or rather the signal encompassing the digital content.

As shown in FIG. 1, the channel coding module 18 is separately formed with respect to the transmitters 16. Thus, the respective channel coding is outsourced, as the individual transmitters 16 do not necessarily have to comprise an internal encoder. The at least partly encoded digital content or rather the at least partly encoded signal encompassing the digital content is forwarded to the respective transmitters 16 in a fourth step S4.

In a fifth step S5, the individual transmitters 16 processing the digital content received from the channel coding module 18 transmit the respective signals over-the-air. By doing so, the transmitters 16 take the control signals forwarded into consideration so that it is ensured that the digital content or rather the respective signals encompassing the digital content are transmitted in an intended manner, for instance in a synchronized manner.

Put differently, the transmitters 16 are configured to perform (only) baseband signal processing on the digital content received, whereas the channel coding is outsourced.

The outsourced or rather separately formed channel coding module 18 may have computational power that is higher than the computational power of an individual encoder used by transmitters known in the state of the art. Therefore, improved encoding techniques may be established. Furthermore, the entire costs of the broadcasting system 10 can be reduced significantly.

Certain embodiments disclosed herein, for example the respective module(s), utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the terms "circuitry," "circuit," and "one or more circuits" can be used interchangeably herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A broadcasting system for broadcasting and/or streaming of data, wherein the broadcasting system comprises a gateway and at least one transmitter, wherein the gateway is configured to forward digital content received to the transmitter, wherein the transmitter is configured to transmit the digital content over-the-air, wherein the broadcasting system comprises a channel coding circuit that is separately formed with respect to the transmitter and the gateway, wherein the channel coding circuit is established by a separately formed processing circuit, wherein the channel coding circuit is configured to perform the channel coding of the digital content at least partly which is to be transmitted over-the-air by the transmitter wherein the channel coding circuit interfaces via an interface a transmission line established between the gateway and the transmitter such that the channel coding circuit is interconnected between the gateway and the transmitter.

2. The broadcasting system according to claim 1, wherein the channel coding circuit is configured to at least pre-code a signal to be transmitted over-the-air.

3. The broadcasting system according to claim 2, wherein the channel coding circuit is configured to completely encode the signal to be transmitted over-the-air.

4. The broadcasting system according to claim 3, wherein the channel coding circuit is configured to forward at least one of a time stamp and a transmission time to the transmitter.

5. The broadcasting system according to claim 1, wherein the channel coding circuit is configured to forward at least one control signal to the transmitter.

6. The broadcasting system according to claim 1, wherein the interface is provided upstream of the transmitter or at the transmitter.

7. The broadcasting system according to claim 1, wherein the channel coding circuit is a separately formed server.

8. The broadcasting system according to claim 1, wherein the transmitter and the channel coding circuit are interconnected with each other via a respective communication interface.

9. The broadcasting system according to claim 1, wherein the transmitter is established in an encoder-free manner.

10. The broadcasting system according to claim 1, wherein the broadcasting system comprises several transmitters that are assigned to the gateway and the channel coding circuit.

11. The broadcasting system according to claim 1, wherein the channel coding circuit is a centralized channel coding circuit.

12. The broadcasting system according to claim 1, wherein the broadcasting system is a single frequency network (SFN).

13. A method of processing data to be transmitted over-the-air, comprising:
   providing digital content to be transmitted by a gateway;
   forwarding the digital content to at least one transmitter via a channel coding circuit that analyzes the digital content by the gateway, wherein the channel coding circuit is interconnected between the gateway and the transmitter such that the digital content forwarded to the transmitter is previously processed by the channel coding circuit that is a separately formed processing circuit which is separately formed with respect to the transmitter and the gateway;
   performing a channel coding of the digital content at least partly by the channel coding circuit and
   forwarding the at least partly coded digital content to the transmitter.

14. The method according to claim 13, wherein a signal to be transmitted over-the-air is pre-coded by the channel coding circuit.

15. The method according to claim 13, wherein a signal to be transmitted over-the-air is completely encoded by the channel coding circuit.

16. The method according to claim 13, wherein at least one control signal is forwarded to the transmitter by the channel coding circuit.

17. The method according to claim 13, wherein the transmitter performs baseband signal processing.

18. A broadcasting system for broadcasting and/or streaming of data, wherein the broadcasting system comprises a gateway and at least one transmitter, wherein the gateway is configured to forward digital content received to the transmitter, wherein the transmitter is configured to transmit the digital content over-the-air, wherein the broadcasting system comprises a channel coding circuit that is separately formed with respect to the transmitter, wherein the channel coding circuit is configured to perform the channel coding of the digital content at least partly which is to be transmitted over-the-air by the transmitter, wherein the channel coding circuit is separately formed with respect to the gateway, wherein the channel coding circuit, the gateway and the at least one transmitter each have their own housing such that the channel coding circuit is not commonly housed with the at least one transmitter or the gateway, and wherein the channel coding circuit is interconnected between the gateway and the at least one transmitter, thereby establishing a transmission line.

* * * * *